United States Patent [19]
Bran

[11] Patent Number: 6,039,059
[45] Date of Patent: *Mar. 21, 2000

[54] WAFER CLEANING SYSTEM

[75] Inventor: Mario E. Bran, Garden Grove, Calif.

[73] Assignee: Verteq, Inc., Santa Ana, Calif.

[ * ] Notice: This patent issued on a continued prosecution application filed under 37 CFR 1.53(d), and is subject to the twenty year patent term provisions of 35 U.S.C. 154(a)(2).

[21] Appl. No.: 08/724,518

[22] Filed: Sep. 30, 1996

[51] Int. Cl.[7] ........................................... B08B 3/12
[52] U.S. Cl. ........................... 134/105; 134/147; 134/148
[58] Field of Search ........................... 134/2, 1, 1.3, 902, 134/153, 105, 147, 148; 310/323, 325

[56] References Cited

U.S. PATENT DOCUMENTS

| | | |
|---|---|---|
| 2,498,737 | 2/1950 | Holden . |
| 2,699,403 | 1/1955 | Courts . |
| 2,713,998 | 7/1955 | Eicken . |
| 2,738,173 | 3/1956 | Massa . |
| 2,760,501 | 8/1956 | Gander . |
| 2,802,476 | 8/1957 | Kearney . |
| 2,814,575 | 11/1957 | Lange, Jr. . |
| 2,934,661 | 4/1960 | Chambers . |
| 2,950,725 | 8/1960 | Jacke et al. . |
| 3,077,155 | 2/1963 | Maddock et al. . |
| 3,114,654 | 12/1963 | Nishiyama et al. . |

(List continued on next page.)

FOREIGN PATENT DOCUMENTS

| | | |
|---|---|---|
| 319-806 | 6/1989 | European Pat. Off. . |
| 0 233 940 | 11/1993 | European Pat. Off. ....... A61H 23/02 |
| 3212-916 | 10/1983 | Germany . |
| 54-7874 | 1/1979 | Japan . |
| 54-69260 | 4/1979 | Japan . |
| 62-281431 | 12/1987 | Japan . |
| 63-36534 | 2/1988 | Japan . |
| 64-18229 | 1/1989 | Japan . |
| 1-245835 | 10/1989 | Japan . |
| 1-304733 | 12/1989 | Japan . |
| 1-316935 | 12/1989 | Japan . |

OTHER PUBLICATIONS

International Search Report for corresponding PCT Application No. PCT/US97/11812 dated Nov. 10, 1997.
"10 MHz Ultrasonic Silicon Cleaning Tool", IBM Technical Disclosure Bulletin, vol. 37, No. 6A, p. 585, Jun. 1, 1994.
Stuart A. Hoenig; Cleaning Surfaces With Dry Ice; *Compressed Air Magazine*; Aug. 1986; pp. 22–25.

(List continued on next page.)

*Primary Examiner*—Lynette R. F. Smith
*Assistant Examiner*—Brenda G. Brumback
*Attorney, Agent, or Firm*—Knobbe, Martens, Olson & Bear LLP

[57] ABSTRACT

A wafer cleaning system cleans semiconductor wafers using megasonic energy to agitate cleaning fluid applied to the wafer. A source of acoustic energy vibrates an elongated quartz probe which transmits the acoustic energy into the fluid. One form of the probe has a solid cylindrical-shaped cleaning portion within the tank and a flared rear portion with an increasing diameter outside the tank. A heat transfer member acoustically coupled to the larger rear portion of the probe and to a transducer conducts heat away from the transducer. A housing for the heat transfer member and transducer supports those components and provides means for conducting coolant through the housing to control the temperature of the transducer. In one arrangement, fluid is sprayed onto both sides of a wafer while a probe is positioned close to an upper side. In another arrangement, a short probe is positioned with its end face close to the surface of a wafer, and the probe is moved over the wafer as it rotates. The probe may also be positioned through a central hole in a plurality of discs to clean a group of such elements at one time.

28 Claims, 9 Drawing Sheets

U.S. PATENT DOCUMENTS

| | | |
|---|---|---|
| 3,373,752 | 3/1968 | Inoue . |
| 3,401,708 | 9/1968 | Henes . |
| 3,499,792 | 3/1970 | Veith . |
| 3,596,883 | 8/1971 | Brech . |
| 3,676,963 | 7/1972 | Rice et al. . |
| 3,694,675 | 9/1972 | Loveday . |
| 3,700,937 | 10/1972 | Rissolo . |
| 3,702,519 | 11/1972 | Rice et al. . |
| 3,845,332 | 10/1974 | Last . |
| 3,893,869 | 7/1975 | Mayer et al. . |
| 3,900,162 | 8/1975 | Titus et al. . |
| 3,972,018 | 7/1976 | Erickson . |
| 4,027,686 | 6/1977 | Shortes et al. . |
| 4,038,786 | 8/1977 | Fong . |
| 4,111,546 | 9/1978 | Maret . |
| 4,178,188 | 12/1979 | Dussault et al. . |
| 4,183,011 | 1/1980 | Massa . |
| 4,326,553 | 4/1982 | Hall . |
| 4,373,944 | 2/1983 | Glick et al. . |
| 4,389,820 | 6/1983 | Fong et al. . |
| 4,401,131 | 8/1983 | Lawson . |
| 4,402,458 | 9/1983 | Lierke et al. . |
| 4,461,651 | 7/1984 | Hall . |
| 4,489,740 | 12/1984 | Rattan et al. . |
| 4,537,511 | 8/1985 | Frei . |
| 4,543,130 | 9/1985 | Shwartzman . |
| 4,565,942 | 1/1986 | Sakai et al. . |
| 4,579,000 | 4/1986 | Sudo . |
| 4,591,485 | 5/1986 | Olsen et al. . |
| 4,631,250 | 12/1986 | Hayashi . |
| 4,635,666 | 1/1987 | Daley et al. . |
| 4,655,847 | 4/1987 | Ichinoseki et al. . |
| 4,691,725 | 9/1987 | Parisi . |
| 4,694,527 | 9/1987 | Yoshizawa . |
| 4,744,181 | 5/1988 | Moore et al. . |
| 4,747,421 | 5/1988 | Hayashi . |
| 4,804,007 | 2/1989 | Bran . |
| 4,806,171 | 2/1989 | Whitlock et al. . |
| 4,823,041 | 4/1989 | Inoue et al. . |
| 4,857,113 | 8/1989 | Hodge . |
| 4,863,561 | 9/1989 | Freeman et al. . |
| 4,869,278 | 9/1989 | Bran . |
| 4,902,350 | 2/1990 | Steck . |
| 4,917,123 | 4/1990 | McConnell et al. . |
| 4,932,168 | 6/1990 | Tada et al. . |
| 4,936,922 | 6/1990 | Cherry . |
| 4,971,920 | 11/1990 | Miyashita et al. . |
| 4,974,375 | 12/1990 | Tada et al. . |
| 4,978,067 | 12/1990 | Berger et al. . |
| 4,980,300 | 12/1990 | Miyashita et al. . |
| 4,997,490 | 3/1991 | Vetter et al. . |
| 4,998,549 | 3/1991 | Bran . |
| 5,001,084 | 3/1991 | Kawai et al. . |
| 5,013,366 | 5/1991 | Jackson et al. . |
| 5,017,236 | 5/1991 | Moxness et al. . |
| 5,018,988 | 5/1991 | Kibblewhite et al. ................... 439/577 |
| 5,020,200 | 6/1991 | Mimasaka et al. .................... 29/25.01 |
| 5,025,597 | 6/1991 | Tada et al. . |
| 5,035,750 | 7/1991 | Tada et al. . |
| 5,037,481 | 8/1991 | Bran . |
| 5,062,898 | 11/1991 | McDermott et al. . |
| 5,071,776 | 12/1991 | Matsushita et al. . |
| 5,090,432 | 2/1992 | Bran . |
| 5,119,840 | 6/1992 | Shibata . |
| 5,125,979 | 6/1992 | Swain et al. . |
| 5,129,956 | 7/1992 | Pickering et al. . |
| 5,147,466 | 9/1992 | Ohmori et al. . |
| 5,247,954 | 9/1993 | Grant et al. . |
| 5,259,890 | 11/1993 | Goff . |
| 5,279,316 | 1/1994 | Miranda . |
| 5,286,657 | 2/1994 | Bran . |
| 5,316,591 | 5/1994 | Chao et al. . |
| 5,364,474 | 11/1994 | Williford, Jr. . |
| 5,365,960 | 11/1994 | Bran .......................................... 134/184 |
| 5,534,076 | 7/1996 | Bran . |
| 5,721,463 | 2/1998 | Snyder .................................... 310/334 |

OTHER PUBLICATIONS

Va–Tran Systems, Inc.; Sno Gun™ Dry Ice Snow Cleaning System for Electronic, Semi–Conductor, Medical, Optical and Other Diverse Industries.

$CO_2$ Snow/Pellet Cleaning/Super Critical Fluid; *Precision Cleaning*; Dec. 1995; vol. III, No. 11, p. 48.

Robert Sherman; John Grob and Walter Whitlock; Dry Surface Cleaning Using $CO_2$ Snow; *Journal Of Vacuum Science & Technology B*, Second Series, vol. 9, No. 4, Jul./Aug. 1991; pp. 1970–1977.

Wayne T. McDermott, Richard C. Ockovic, Jin Jwang Wu and Robert J. Miller; Removing Submicron Surface Particles Using A Cryogenic Argon–Aerosol Technique; *Microcontamination*; Oct. 1991; pp. 33–36 and 94–95.

Woodruff et al., Abstract, "Steam condensation on electroplated gold: effect of plating thickness", Intl Jnl Heat Mass Trans, vol. 22, pp. 629–632, 1979.

WAFER CLEANING SYSTEM

FIELD OF THE INVENTION

This invention relates to an apparatus and method for cleaning semiconductor wafers or other such items requiring extremely high levels of cleanliness.

BACKGROUND OF THE INVENTION

Semiconductor wafers are frequently cleaned in cleaning solution into which megasonic energy is propagated. Megasonic cleaning systems, which operate at a frequency over twenty times higher than ultrasonic, safely and effectively remove particles from materials without the negative side effects associated with ultrasonic cleaning.

Megasonic energy cleaning apparatuses typically comprise a piezoelectric transducer coupled to a transmitter. The transducer is electrically excited such that it vibrates, and the transmitter transmits high frequency energy into liquid in a processing tank. The agitation of the cleaning fluid produced by the megasonic energy loosens particles on the semiconductor wafers. Contaminants are thus vibrated away from the surfaces of the wafer. In one arrangement, fluid enters the wet processing container from the bottom of the tank and overflows the container at the top. Contaminants may thus be removed from the tank through the overflow of the fluid.

A gas impingement and suction cleaning process for electrostatographic reproducing apparatuses which utilizes ultrasonic energy and air under pressure is disclosed in U.S. Pat. No. 4,111,546, issued to Maret.

A process for cleaning by cavitation in liquefied gas is disclosed in U.S. Pat. No. 5,316,591, issued to Chao et al. Undesired material is removed from a substrate by introducing a liquefied gas into a cleaning chamber and exposing the liquefied gas to cavitation-producing means. The shape of the horn to provide the cavitation is not disclosed in detail and does not concentrate the sonic agitation to a particular location within the cleaning vessel.

In U.S. Pat. No. 4,537,511, issued to Frei, an elongated metal tube in a tank of cleaning fluid is energized in the longitudinal wave mode by a transducer that extends through a wall of the tank and is attached to the end of the tube. In order to compensate for relatively high internal losses, the radiating arrangement uses a relatively thin-walled tubular member.

A need exists for an improved apparatus and method which can be used to clean semiconductor wafers.

SUMMARY OF THE INVENTION

In one embodiment of the present invention, a vibrator, such as a source of acoustic energy, vibrates an elongated probe which extends into a cleaning tank to clean the surface of articles in close proximity with the probe. A heat transfer member is attached to the rear of the probe to control the temperature of the apparatus. A piezoelectric transducer acoustically coupled to the heat transfer member and connected to a source of megasonic energy provides a means for vibrating the probe.

The elongated probe is made of quartz or some other relatively inert, non-contaminating material which efficiently transmits acoustic energy. The probe comprises a tip portion, a cleaning portion, and a rear portion. The cross-section of the probe is preferably round, and the diameter of the cross-section of the cleaning portion of the probe is smaller in diameter than the cross-section of the rear portion of the probe so as to concentrate the energy. The cleaning portion of the probe preferably has a constant diameter to form a solid cylindrical-shaped section.

From the constant diameter of the cylindrical-shaped section, the cross-section of the rear portion of the probe flares or increases. In a first embodiment, the diameter of the cross-section of the rear portion of the probe gradually increases. In an alternative embodiment of the present invention, the diameter of the cross-section of the rear portion of the probe increases in stepped increments.

In one embodiment, the probe is acoustically coupled to a spool-shaped, gold-plated, aluminum heat transfer member. In one arrangement the probe is bonded to the heat transfer member, and in another, the probe is coupled to the heat transfer member under spring pressure. A transducer is acoustically coupled to the other side of the heat transfer member, and both the heat transfer member and the transducer are contained within a housing. The housing has an inlet and an outlet for coolant which controls the temperature of the probe and the transducer and an electrical convertor for RF energy.

The housing is mounted to the exterior of the processing tank and provides support for the probe which is positioned through an opening of the processing tank wall. The probe is positioned parallel to and in close proximity to a semiconductor wafer. Spacers or stand-offs advantageously position the transducer and larger rear portion of the probe outside the tank so that only the smaller diameter cleaning portion of the probe and the probe tip extend into the tank.

In use, the processing tank may be filled with fluid, a wafer positioned on a support within the processing tank, close to the probe, on the inner surface and the probe is vibrated megasonically causing fluid in the tank to be agitated. The wafer is rotated or otherwise moved in relation to the probe so that the entire surface of the wafer to be cleaned comes within close proximity to the probe. With a different probe mounting arrangement, the probe can be moved relative to the wafer.

Instead of being immersed in fluid, the probe may be positioned adjacent a wafer surface onto which fluid is sprayed. Megasonic energy is conducted through the fluid layer, and loosened particles are carried away by the liquid.

In another arrangement, discs having a central hole may be cleaned by having the probe extend through one or more discs positioned in a tank.

DETAILED DESCRIPTION OF THE PREFERRED EMBODIMENT

Figure 1:
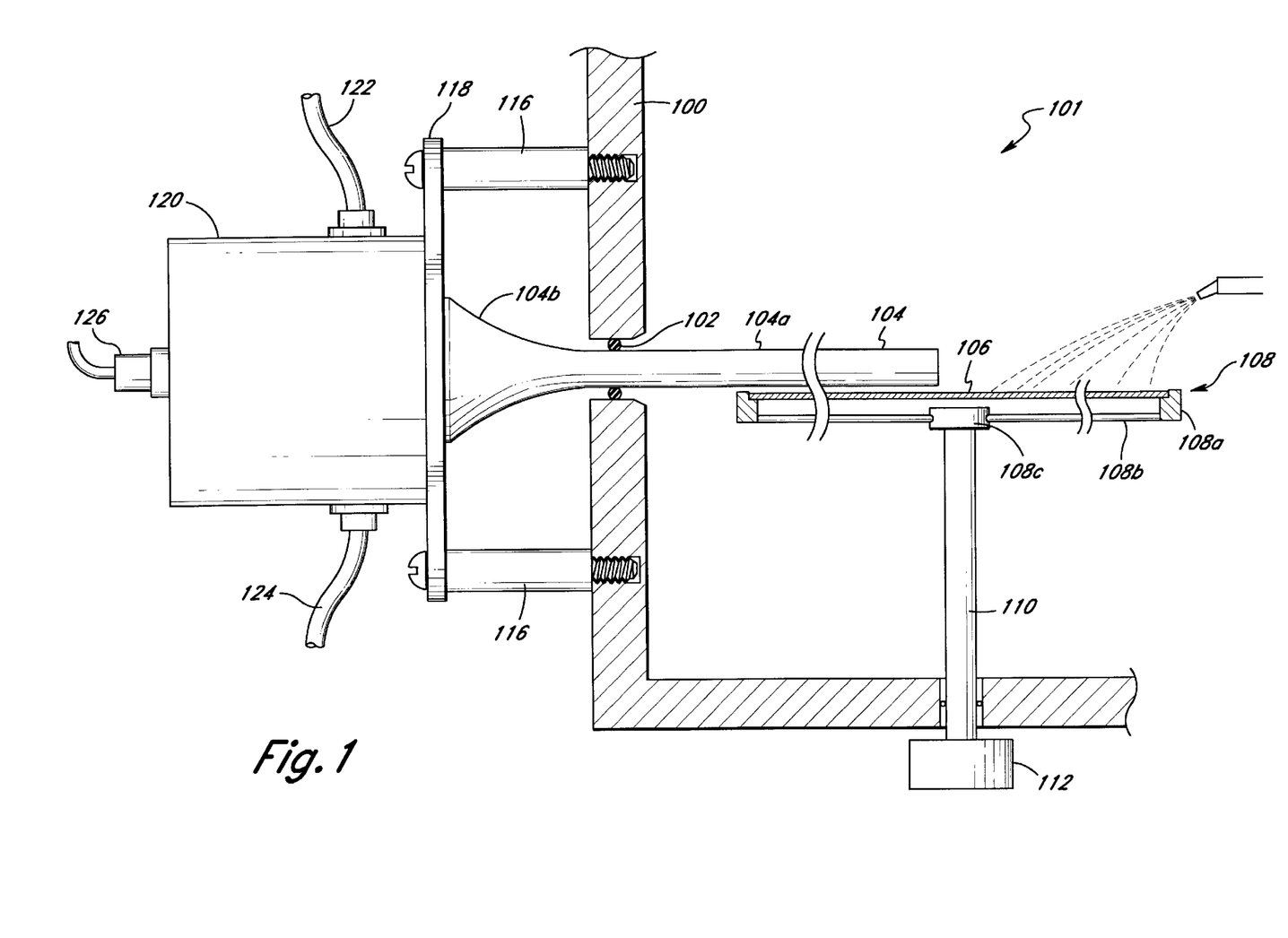
FIG. 1 is a side elevational view of one embodiment of the megasonic energy cleaning system of the present invention.
Figure 2:
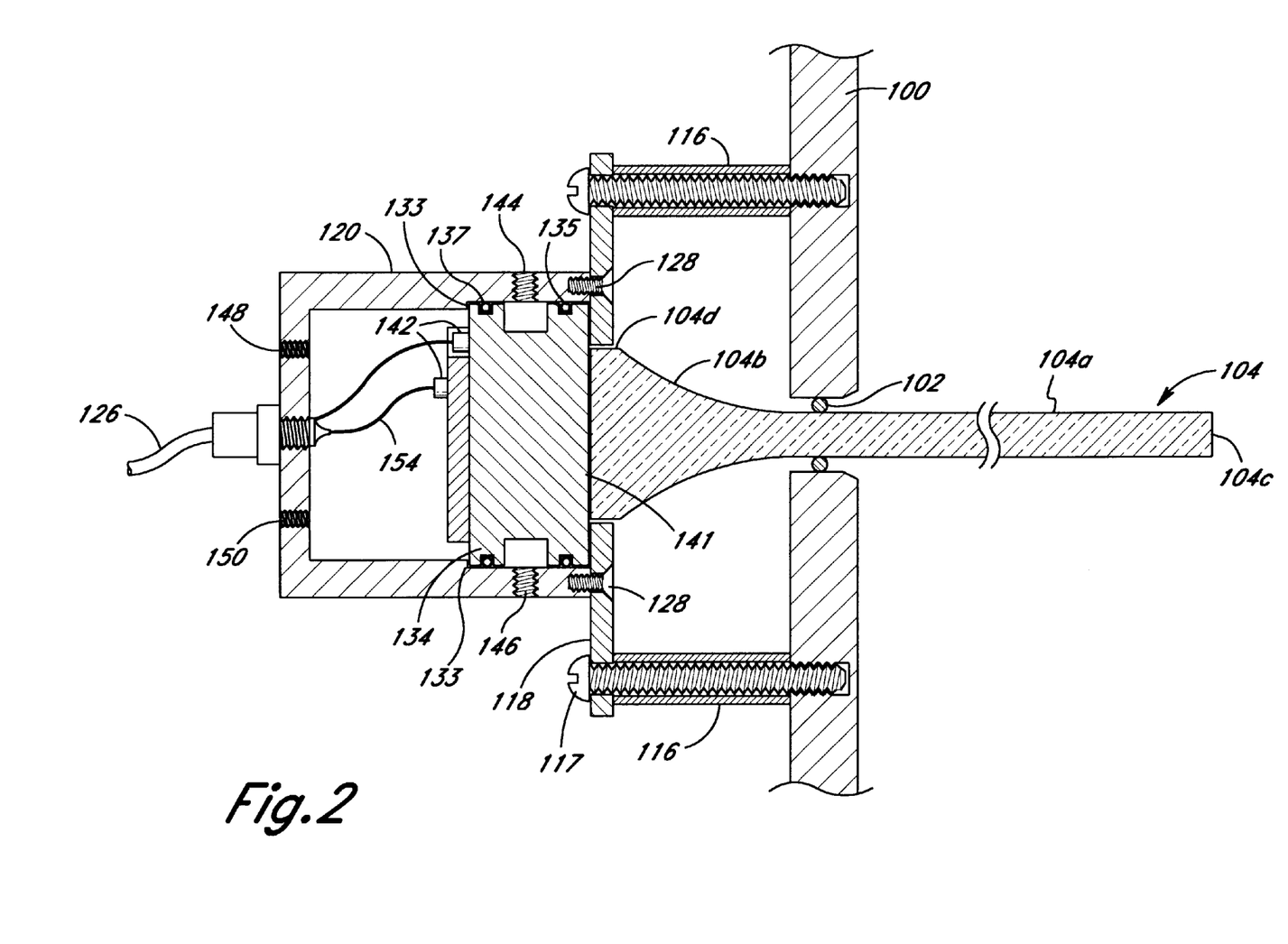
FIG. 2 is a side cross-sectional view of the system shown in FIG. 1.
Figure 3:
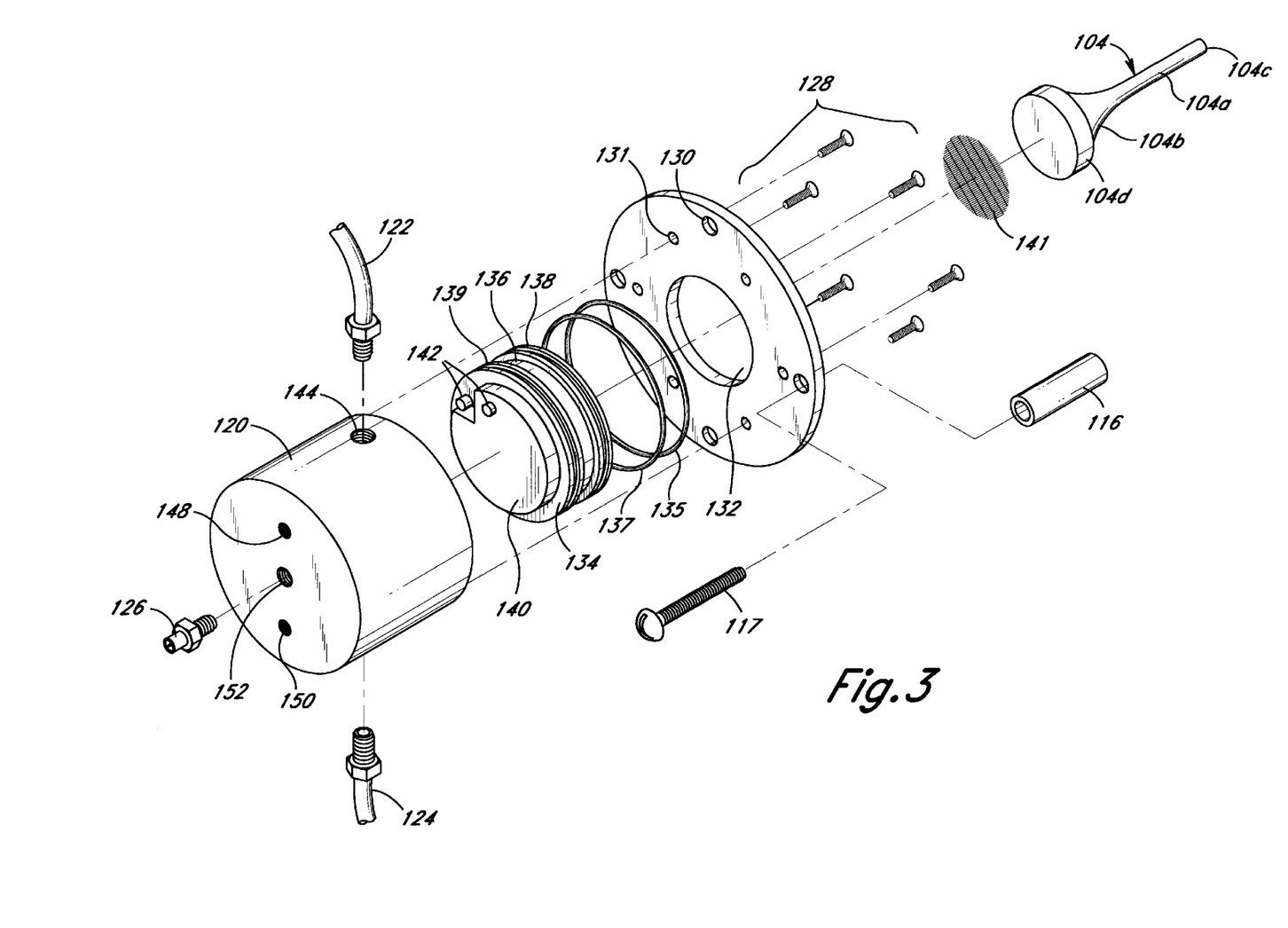
FIG. 3 is an exploded perspective view of the probe assembly shown in FIG. 1.

FIGS. 1–3 illustrate a megasonic energy cleaning apparatus made in accordance with the present invention with an elongated probe 104 inserted through the wall 100 of a processing tank 101. As seen, the probe is supported in cantilever fashion on one end exterior of the container. A suitable O-ring 102, sandwiched between the probe 104 and the tank wall, provides a proper seal for the processing tank 101. A heat transfer member 134, contained within a housing 120, is acoustically and mechanically coupled to the probe 104. Also contained within the housing 120 is a piezoelectric transducer 140 acoustically coupled to the heat transfer member 134. Electrical connectors 142, 154, and 126 are connected between the transducer 140 and a source of acoustic energy (not shown).

The housing supports an inlet conduit 124 and an outlet conduit 122 for coolant and has an opening 152 for electrical connectors. The housing is closed by an annular plate 118 with an opening 132 for the probe. The plate in turn is attached to the tank.

Within the processing tank 101, a support or susceptor 108 is positioned parallel to and in close proximity to the probe 104. The susceptor 108 may take various forms, the arrangement illustrated including an outer rim 108a supported by a plurality of spokes 108b connected to a hub 108c supported on a shaft 110, which extends through a bottom wall of the processing tank 101. Outside the tank 101, the shaft 110 is connected to a motor 112.

The elongated probe 104 is preferably made of a relatively inert, non-contaminating material, such as quartz, which efficiently transmits acoustic energy. While utilizing a quartz probe is satisfactory for most cleaning solutions, solutions containing hydrofluoric acid can etch quartz. Thus, a probe made of sapphire or silicon carbide or boron nitride may be employed instead of quartz. Also, quartz may be coated by a material that can withstand HF such as silicon carbide or vitreous carbon.

The probe 104 comprises a solid, elongated, constant cross-section cleaning portion 104a, and a rear portion 104b. The cross-section of the probe is preferably round and advantageously, the diameter of the cleaning portion of the probe is smaller in diameter than the rear portion of the probe. In a prototype arrangement the area of the rear face of the rear portion 104b is 25 times that of the tip face of portion 104a. Of course, cross-sectional shapes other than circular may be employed.

A cylindrically-shaped cleaning section 104a having a small diameter is desirable to concentrate the megasonic energy along the length of the section 104a.

The diameter of the probe, however, should be sufficient to withstand mechanical vibration produced by the megasonic energy transmitted by the probe. In a prototype, the cross-section diameter of the cylindrical portion of the probe contained within the tank was approximately 0.4 of an inch.

The probe cleaning portion 104a should be long enough so that the entire surface area of the wafer is exposed to the probe during wafer cleaning. In a preferred embodiment, because the wafer is rotated beneath the probe, the length of the cleaning portion 104b should be long enough to reach at least the center of the wafer. Therefore, as the wafer is rotated beneath the probe, the entire surface area of the wafer is close to the probe. Actually, the probe could probably function satisfactorily even if it does not reach the center of the wafer since megasonic vibration from the probe tip would provide some agitation towards the wafer center.

The length of the probe is also determined by a predetermined number of wavelengths. In one embodiment, the length of the probe cleaning portion 104a equals nineteen wavelengths of the applied energy.

The rear probe portion 104b, which is positioned exterior the tank, flares to a diameter larger than the diameter of the cleaning portion 104a. In a first embodiment of the present invention, shown in FIGS. 1–3, the diameter of the cross-section of the rear portion of the probe gradually increases to a cylindrical section 104d. The large surface area at the end of the rear portion 104d is advantageous for transmitting a large amount of megasonic energy which is then concentrated in the smaller diameter section 104a.

Figure 4:
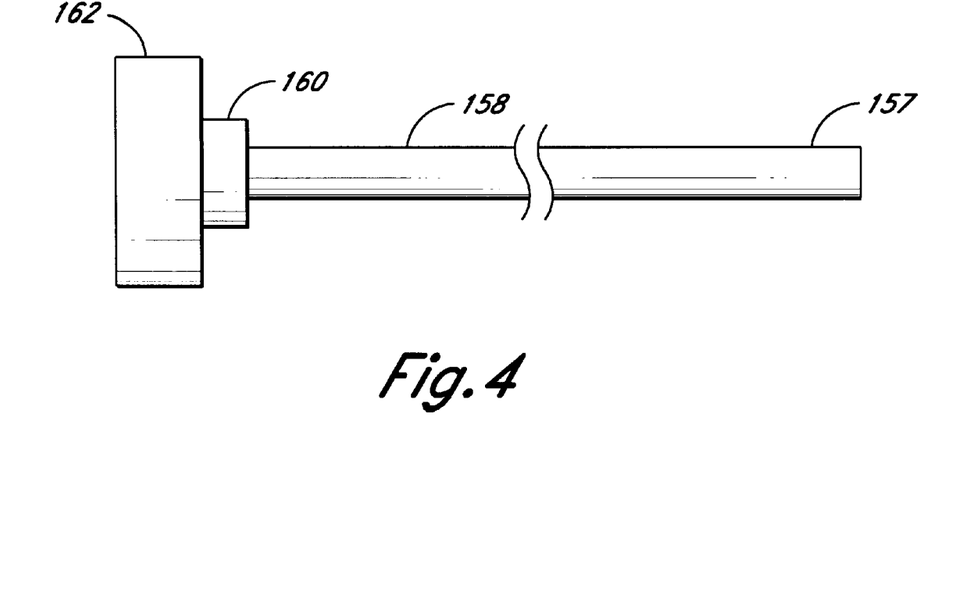
FIG. 4 is a side view of an alternative probe in accordance with the present invention.

As illustrated in FIG. 4, in an alternative embodiment of the present invention, the diameter of the cross-section of the rear portion of the probe increases in stepped increments, rather than gradually. The stepped increments occur at wavelength multiples to efficiently transmit the megasonic energy. For example, in one embodiment, the thinnest portion 158 of the probe has a length of approximately nineteen wavelengths, the next larger diameter portion 160 is about three wavelengths in axial length and the largest diameter portion 162 is about four wavelengths in axial length. The goal is to simulate the results obtained with the tapered arrangement of FIG. 1.

Figure 5A:
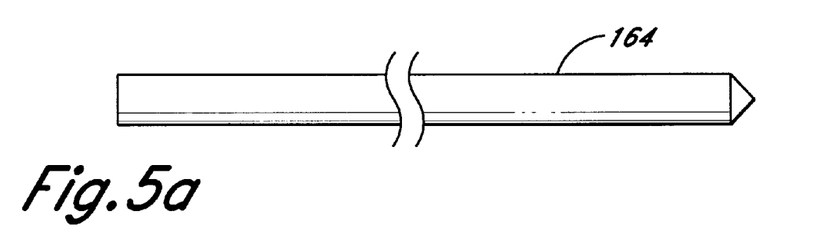
FIGS. 5a–5c are alternative probe tips which may be used in connection with the present invention.
Figure 5B:
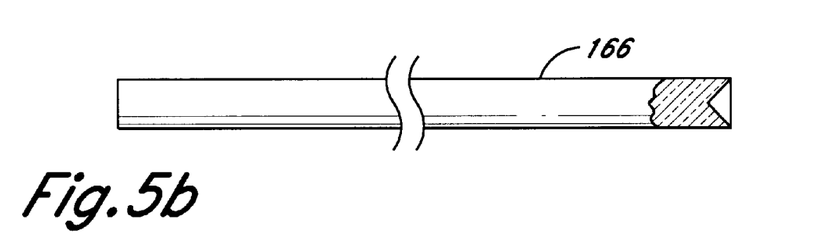
Figure 5C:
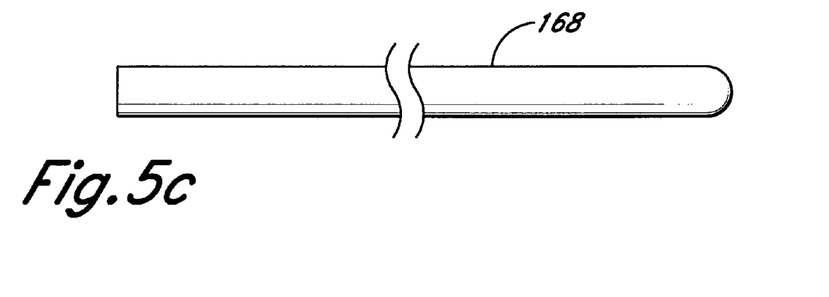

FIGS. 5a–5c depict further embodiments for the tip of the probe. The different probe tips may help cover a portion of the wafer surface that otherwise would not be covered by a flat probe end 157. The probe may have a conical tip 164, an inverted conical tip 166, or a rounded tip 168.

The probe larger end 104d is acoustically coupled to a heat transfer member 134 and is physically supported by that member. The probe end face is preferably bonded or glued to the support by a suitable adhesive material. In addition to the bonding material, a thin metal screen 141, shown in FIG. 3, is sandwiched between the probe end and the member 134. The screen with its small holes filled with adhesive provides a more permanent vibration connection than that obtained with the adhesive by itself. The screen utilized in a prototype arrangement was of the expanded metal type, only about 0.002 inch thick with flattened strands defining pockets between strands capturing the adhesive. The adhesive employed was purchased from E. V. Roberts in Los Angeles and formed by a resin identified as number 5000, and a hardener identified as number 61. The screen material is sold by a U.S. company, Delkar. The probe can possibly be clamped or otherwise coupled to the heat transfer member so long as the probe is adequately physically supported and megasonic energy is efficiently transmitted to the probe.

The heat transfer member 134 is made of aluminum, or some other good conductor of heat and megasonic energy. In the arrangement illustrated, the heat transfer member is cylindrical and has an annular groove 136, which serves as a coolant duct large enough to provide an adequate amount of coolant to suitably cool the apparatus. Smaller annular grooves 138, 139 on both sides of the coolant groove 136 are fitted with suitable seals, such as O-rings 135, 137 to isolate the coolant and prevent it from interfering with the electrical connections to the transducer 140.

The transducer 140 is bonded, glued, or otherwise acoustically coupled to the rear flat surface of the heat transfer member 134. A suitable bonding material is that identified as ECF 550, available from Ablestick of Gardena, Calif. The transducer 140 is preferably disc shaped and has a diameter larger than the diameter of the rear end of the probe section 104*d* to maximize transfer of acoustic energy from the transducer to the probe. The heat transfer member is preferably gold-plated to prevent oxidizing of the aluminum and, hence, provide better bonding to the transducer and the probe.

The transducer 140 and the heat transfer member 134 are both contained within the housing 120 that is preferably cylindrical in shape. The heat transfer member is captured within an annular recess 133 in an inner wall of the housing 120.

The housing is preferably made of aluminum to facilitate heat transfer to the coolant. The housing has openings 144 and 146 for the outlet 122 and the inlet conduit 124 for the liquid coolant. On its closed end, the housing 134 has an opening 152 for the electrical connections 126 and 154. Openings 148, 150 allow a gaseous purge to enter and exit the housing 120.

An open end of the housing 120 is attached to the annular plate 118 having the central opening 132 through which extends the probe rear section 104*d*. The annular plate has an outer diameter extending beyond the housing 120 and has a plurality of holes organized in two rings through an inner ring of holes 131, a plurality of connectors 128, such as screws, extend to attach the plate 118 to the housing 120. The annular plate 118 is mounted to the tank wall 100 by a plurality of threaded fasteners 117 that extend through the outer ring of plate holes 130 and thread into the tank wall 100. The fasteners also extend through sleeves or spacers 116 that space the plate 118 from the tank wall. The spacers position the transducer and flared rear portion 104*b* of the probe outside the tank so that only the cleaning portion of the probe and the probe tip extend into the tank. Also, the spacers isolate the plate 118 and the housing from the tank somewhat, so that vibration from the heat transfer member, the housing and the plate to the wall is minimized.

The processing tank 101 is made of material that does not contaminate the wafer. The tank should have an inlet (not shown) for introducing fluid into the tank and an outlet (not shown) to carry away particles removed from the article.

As the size of semiconductor wafers increases, rather than cleaning a cassette of wafers at once, it is more practical and less expensive to use a cleaning apparatus and method that cleans a single wafer at a time. Advantageously, the size of the probe of the present invention may vary in length depending on the size of the wafer to be cleaned.

A semiconductor wafer 106 or other article to be cleaned is placed on the support 108 within the tank 101. The wafer is positioned sufficiently close to the probe so that the agitation of the fluid between the probe and the wafer loosens particles on the surface of the wafer. Preferably, the distance between the probe and surface of the wafer is no greater than about 0.1 of an inch.

The motor 112 rotates the support 108 beneath the probe 104 so that the entire upper surface of the article is sufficiently close to the vibrating probe 104 to remove particles from the surface of the article. To obtain the necessary relative movement between the probe and the wafer 106, an arrangement could be provided wherein the wafer is moved transversely beneath the probe. Also, an arrangement could be provided wherein the support 108 remains in place while a probe moves above the surface of the wafer 106.

When the piezoelectric transducer 140 is electrically excited, it vibrates at a high frequency. Preferably the transducer is energized at megasonic frequencies with a voltage consistent with the probe size. The vibration is transmitted through the heat transfer member 134 and to the elongated probe 104. The probe 104 then transmits the high frequency energy into cleaning fluid between the probe and the wafer. One of the significant advantages of the arrangement is that the large rear portion of the probe can accommodate a large transducer, and the smaller forward probe portion concentrates the megasonic vibration into a small area so as to maximize particle loosening capability. Sufficient fluid substance between the probe and the wafer will effectively transmit the energy across the small gap between the probe and the wafer to produce the desired cleaning. As the surface area of the wafer 106 comes within close proximity to the probe 104, the agitation of the fluid between the probe 104 and the wafer 106 loosens particles on the semiconductor wafer 106. Contaminants are thus vibrated away from the surfaces of the wafer 106. The loosened particles may be carried away by a continued flow of fluid.

Applying significant wattage to the transducer 140 generates considerable heat, which could prevent damage to the transducer 140. Therefore, coolant is pumped through the housing 120 to cool the member 134 and, hence, the transducer.

A first coolant, preferably a liquid such as water, is introduced into one side of the housing 120, circulates around the heat transfer member 134 and exits the opposite end of the housing 120. Because the heat transfer member 134 is made of a good thermal conductor, significant quantities of heat may be easily conducted away by the liquid coolant. The rate of cooling can, of course, be readily monitored by changing the flow rate and/or temperature of the coolant.

A second, optional coolant circulates over the transducer by entering and exiting the housing 120 through openings 148, 150 on the closed end of the housing. Due to the presence of the transducer 140 and the electrical wiring 142, 154, an inert gas such as nitrogen is used as a coolant or as a purging gas in this portion of the housing.

Figure 11:
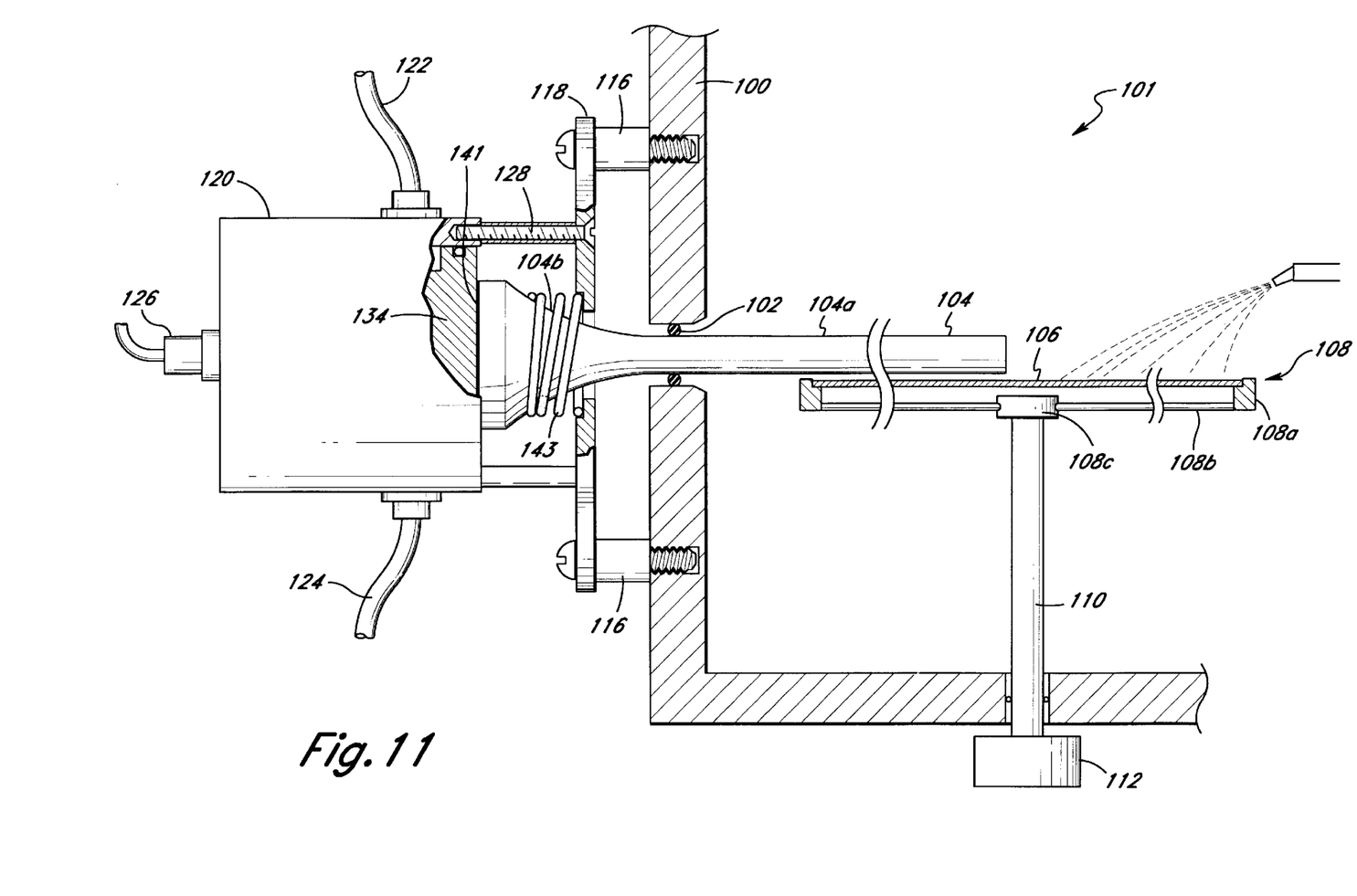
FIG. 11 a side elevational partially sectionalized view of another embodiment of the invention having an alternative means of coupling the probe to a support.

An alternative arrangement for coupling the probe end 104*b* to the member 134 is illustrated in FIG. 11. Instead of having the probe bonded to the member 134, a so-called vacuum grease is applied to the screen 141, and the probe is pressed against the member 134 by a coil spring 143. Vacuum grease is a viscous grease which can withstand pressures on opposite sides of a joint without leaking or being readily displaced. In a prototype arrangement, the combination of the grease and the metal spring provided a reliable acoustic coupling. As may be seen in FIG. 11, the housing 120 instead of being mounted directly to the plate 118, is mounted by standoffs 145 to the plate 118. The sleeves 116 and the fasteners 117 are shorter than that shown in FIG. 2, such that the plate 118 surrounds the tapered portion of the probe. This leaves a gap between the housing 120 and the plate 118. The coil spring 143 is positioned in this gap and compressed between the plate 118 and the tapered portion of the probe. Thus, the spring presses the probe toward the member 134. This arrangement acoustically couples the probe to the heat transfer member 134. A Teflon sleeve 149 is preferably positioned over the first coil of the spring 143 adjacent the probe so that the metal spring does not damage the quartz probe.

Figures 6, 7:
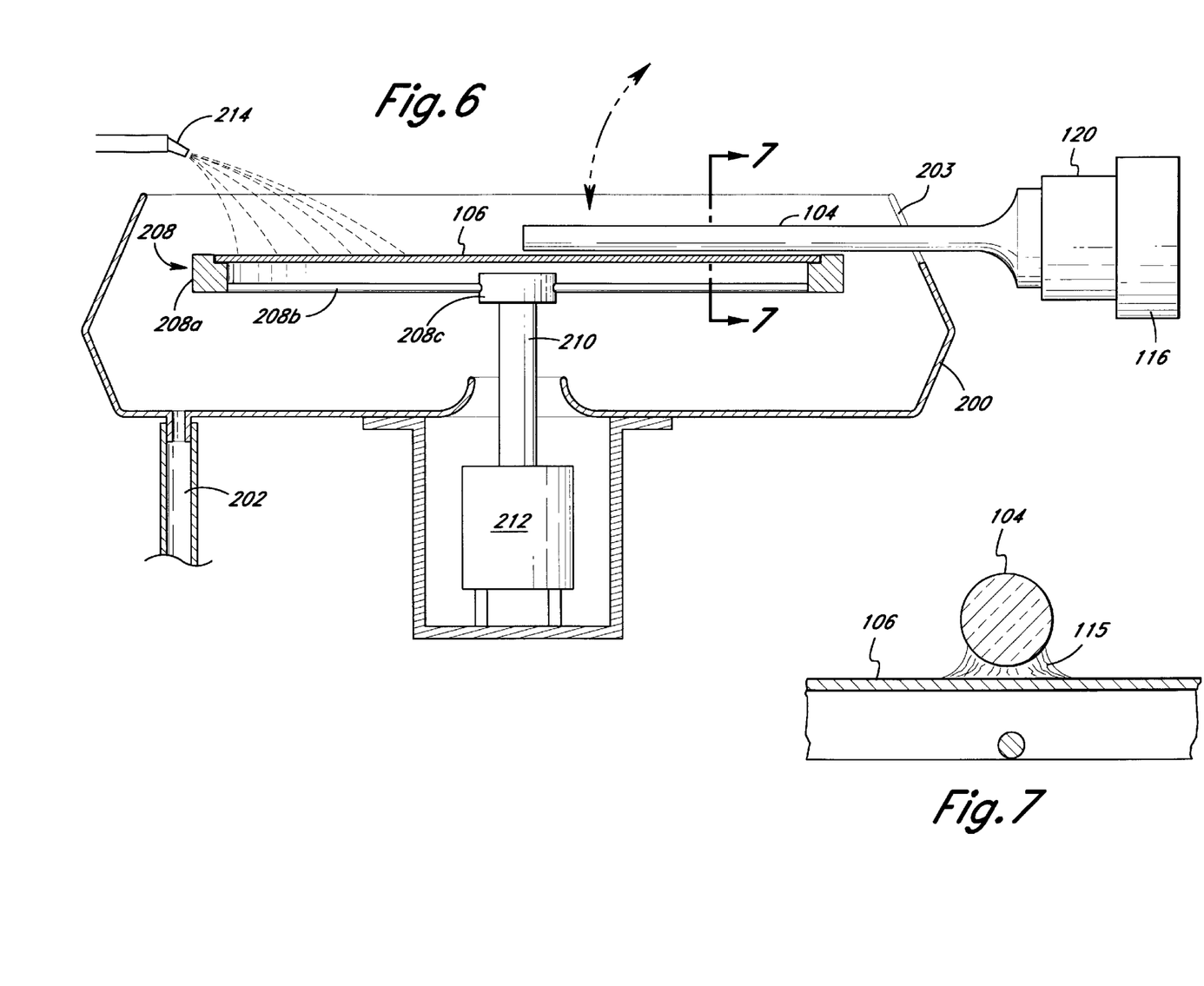
FIG. 6 is a schematic view of the probe of the present invention used with cleaning fluid being sprayed onto the upper surface of a wafer.
FIG. 7 is a cross-sectional view on line 7—7 of FIG. 6.

An arrangement is illustrated in FIG. 6, wherein the probe assembly of FIG. 1 is shown in conjunction with a tank 200 which is open on its upper end and has a drain line 202 in its lower end. The probe 104 is shown extending through a slot 203 into the tank above a wafer 106 mounted on a suitable support 208 including an annular rim 208a, a plurality of spokes 208b, joined to a hub 208c positioned on the upper end of a shaft 210 rotated by a motor 212.

In use, deionized water or other cleaning solution is sprayed onto the upper surface of the wafer from a nozzle 214 while the probe 104 is being acoustically energized. The liquid creates a meniscus 216 between the lower portion of the probe and the adjacent upper surface of the rotating wafer. This is schematically illustrated in FIG. 7. The liquid provides a medium through which the megasonic energy is transmitted to the surface of the wafer to loosen particles. These loosened particles are flushed away by the continuously flowing spray and the rotating wafer. When the liquid flow is interrupted, a certain amount of drying action is obtained through centrifical force of the liquid off of the water.

The probe assembly may be conveniently mounted on a suitable support, schematically illustrated at 216. The support is capable of pivoting the assembly upwardly, as indicated by the arrow 218, to facilitate the installation and removal of wafers. Alternatively, the slot 203 may instead be formed as a hole, closed at the top, and the probe may be moved radially in and out.

Figure 8:
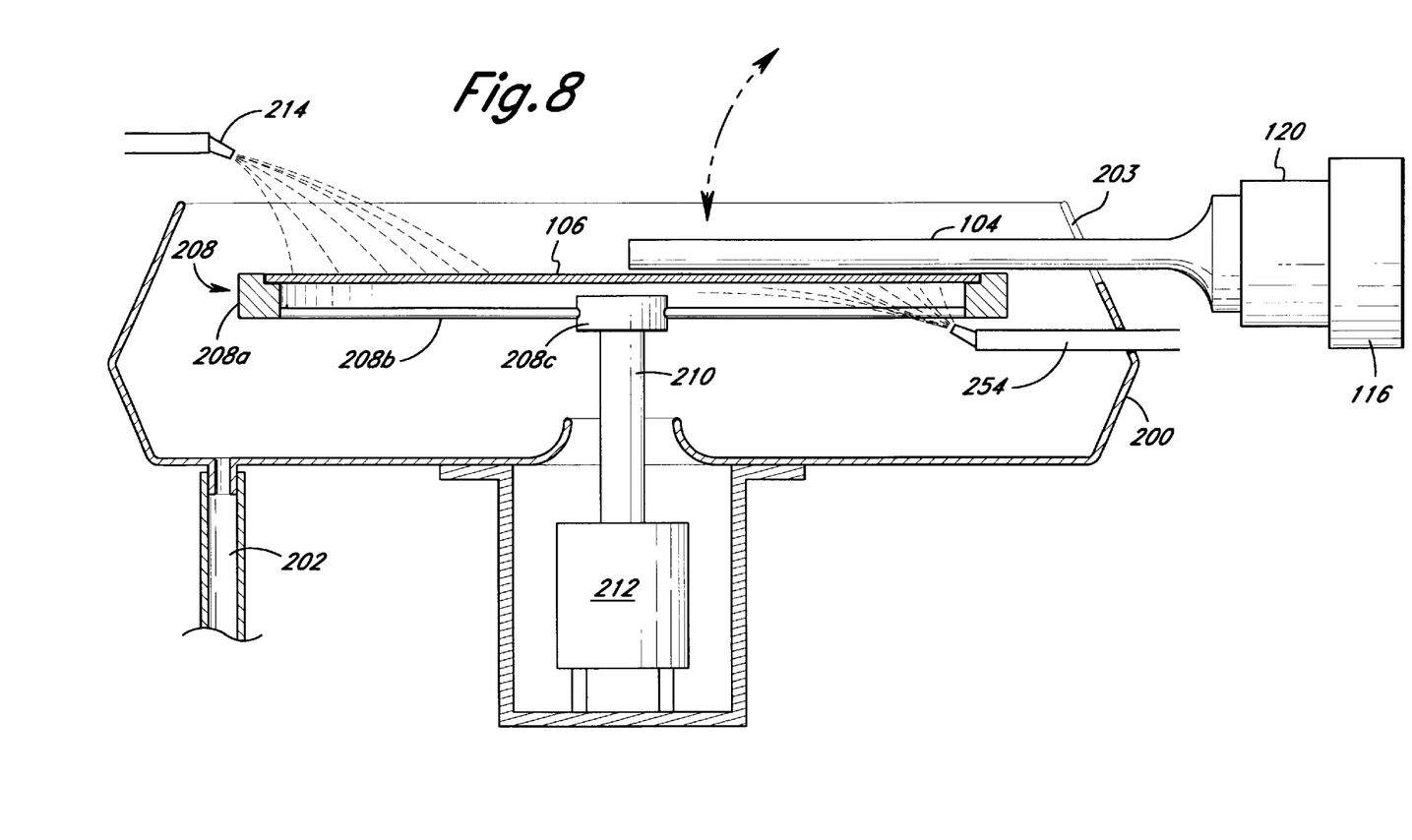
FIG. 8 is a schematic view of the probe cleaning both surfaces of a wafer.

FIG. 8 illustrates an alternative or addition to the arrangement of FIG. 7 wherein both the lower and upper sides of a wafer are cleaned. A spray nozzle 254 extends through a side wall of a tank 200 and is angled upwardly slightly so that cleaning fluid may be sprayed between the spokes 208b and onto the lower surface of a wafer 106 and is directed radially inwardly so that as the wafer rotates, the entire lower surface is sprayed with the fluid. The wafer is subjected to megasonic energy by the probe 104 in the same manner as described above in connection with FIG. 6. This agitation vibrates the wafer as well as the fluid on the lower surface of the wafer which is radially aligned with the probe as the wafer rotates. This agitation loosens particles on the lower surface of the wafer, and the particles are flushed away with the fluid which falls or drips from the lower surface of the wafer.

Various fluids may be employed as the spray applied to the wafer in FIGS. 6 and 8. In addition to liquid or high pressure gas, so-called dry ice snow may be applied. Va-Tran Systems, Inc. of Chula Vista, Calif. markets a product under the trademark SNO GUN for producing and applying such material. A major advantage of that approach is that there is no disposal problem after cleaning. Contamination is carried away from the clean surface in a stream of inert, harmless vapor. Disposal costs of cleaning media are eliminated. Advertising literature regarding the SNO GUN product states that cleaning with dry ice snow removes particles more thoroughly than blowing with dry nitrogen. It is said that the device removes even sub-micron particles as tiny as 0.2 microns, which are difficult or impossible to remove with a nitrogen jet. Such technology is further described in U.S. Pat. No. 5,364,474, which is incorporated herein by reference.

Figure 9:
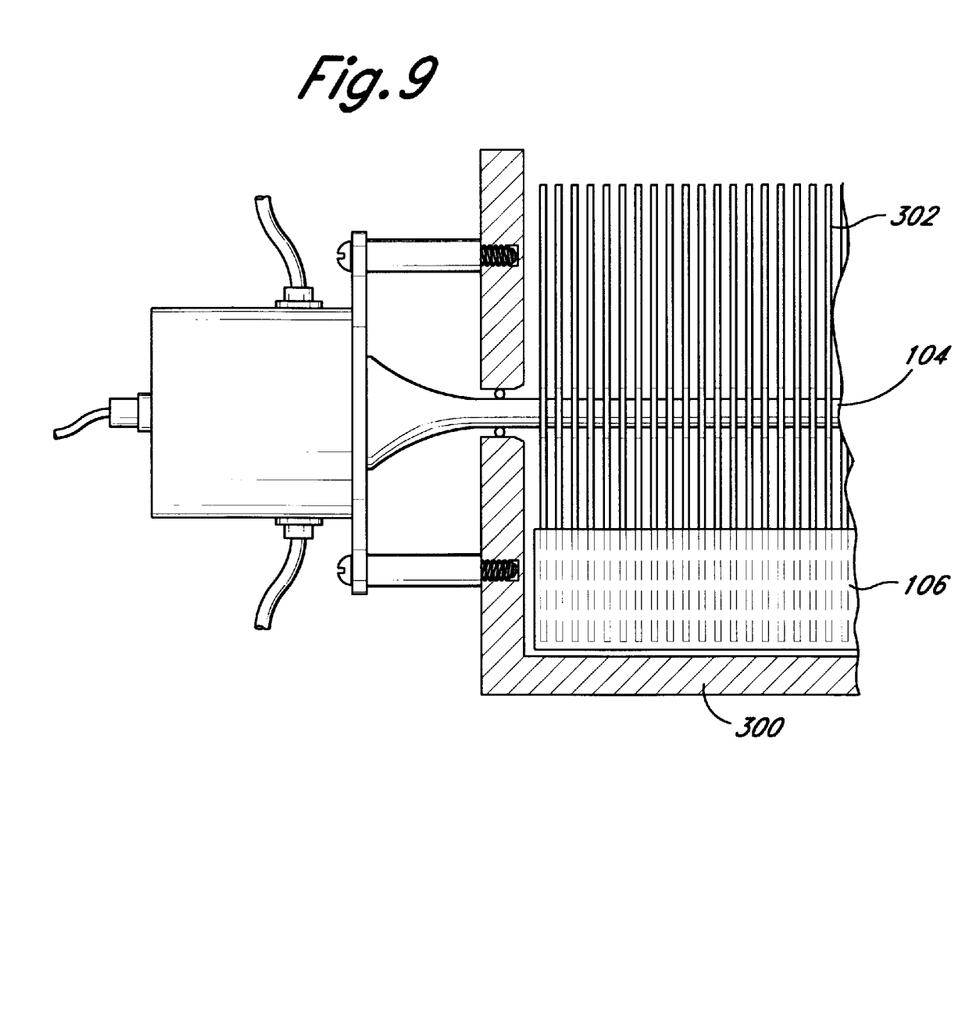
FIG. 9 is a schematic view of the probe of FIG. 1 extending through discs to be cleaned.

Referring to FIG. 9, the probe assembly of FIG. 1 is shown mounted to a wall of a tank 300. The probe 104 extends generally horizontally through central openings in a plurality of vertically orientated substrates such as "compact disks" 302. The disks may be mounted in a cassette 306 immersed in the tank with the holes in the disks aligned with the probe. The cassette carrying the disks can then be moved laterally so that the probe extends through the holes in the disks, without actually contacting the disks. The tank is filled with liquid, such as deionized water to completely cover the disks. The probe is then vibrated by megasonic energy in the manner described above in connection with FIG. 1. The agitation produced by the probe is transmitted into the cleaning liquid between the disks to loosen particles on the surfaces of the disks. The energy propagates radially outward from the probe such that both sides of each disk are exposed to such energy. Cleaning liquid may be introduced into the container in continuous flow and allowed to overflow the upper end of the container to carry away loosened particles.

Figure 9A:
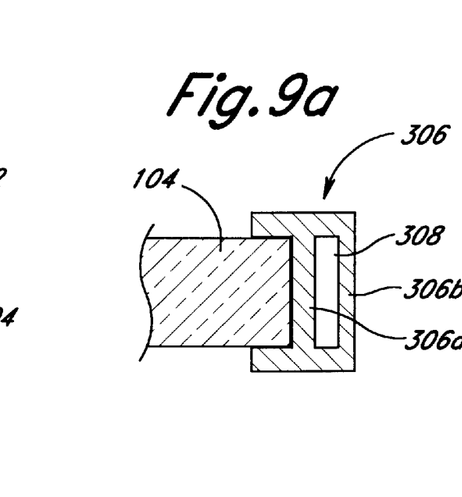
FIG. 9a is a fragmentary, cross sectional view of a cap for a probe tip.
Figure 9B:
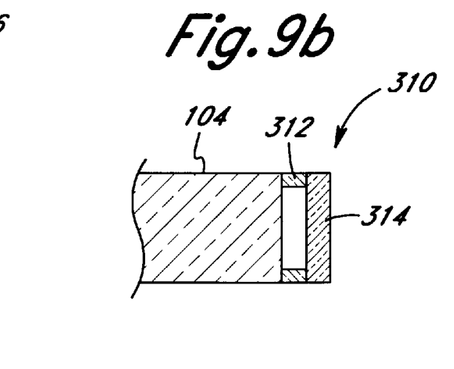
FIG. 9b is a fragmentary, cross sectional view of another probe tip cap.

Because some megasonic energy will be transmitted through the end of the probe with the probe tip immersed in the liquid, a small cap 306 is positioned on the tip of the probe with the cap containing an air space 308 between two glass walls 306a and 306b, as shown in FIG. 9a. Since megasonic energy does not travel through ambient air to any significant degree, the cap prevents the loss of energy through the end of the probe. An alternative cap 310 shown in FIG. 9b employs a short section of glass tubing 212 attached to the end of the probe. As seen, the outer diameter of the tube is equal to the outer diameter of the probe, and the outer end of the tube spaced from the probe is closed by a disc 314.

Figure 10:
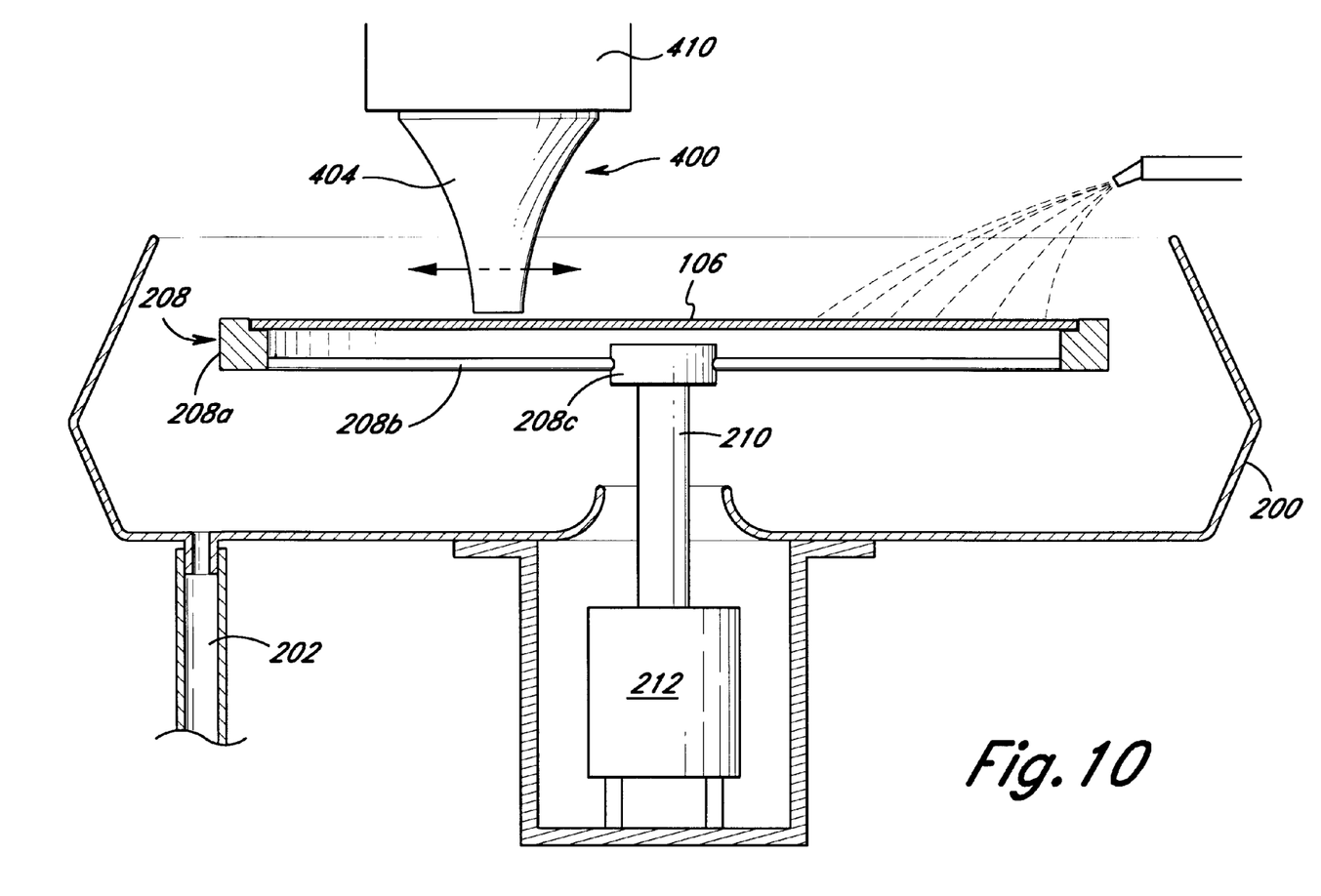
FIG. 10 is a schematic view of a probe vertically oriented with respect to a wafer.

FIG. 10 illustrates another embodiment of the probe of the invention. A probe assembly 400 is shown which is similar to the assembly of FIG. 1 except that the probe 404 is much shorter than the probe 104 in FIG. 1. In addition, the assembly 400 is oriented with the probe extending generally vertically, generally perpendicular to the surface of the horizontal wafer 106. Cleaning fluid is applied to the upper surface of the wafer, and the lower tip of the probe is in contact with this fluid. Consequently, megasonic energy is transmitted through this medium onto the surface of the wafer causing loosening of particles. Since the sides of the probe are not exposed to this medium, there is no appreciable megasonic energy transmitted from the vertical sides of the probe. Instead, such megasonic energy is concentrated into the tip. The tip can be moved radially with respect to the wafer as the wafer rotates so as to apply megasonic energy to the entire surface of the wafer. Alternatively, the probe may traverse the entire upper surface. Any suitable support 410 containing a mechanism to provide the desired movement may be employed.

As mentioned above, the preferred form of the probe assembly includes a probe made of inert material such as quartz and a heat transfer member coupled to the rear of the probe made of a good heat conducting material such as aluminum. Since it is the cylindrical portion of the probe which is in contact with the cleaning fluid and is positioned adjacent the wafer, an alternative arrangement could be devised wherein a forward portion, such as section 104a in FIG. 1 could be made of the inert material and the rear portion 104b could be made of aluminum and hence could be made as one piece with the heat transfer member 134. This of course means that the joint between the two components would be at the rear of the cylindrical portion 104a. While such a bonding area would not be as strong as the arrangement illustrated in FIG. 1, it may be useful in certain situations.

In the other direction, there may be some applications in which it is not necessary to employ quartz or other such inert material for the probe. Instead, the entire probe could be made of aluminum or other such material. In that situation, the heat transfer member could then be made as a one-piece unit with the probe. Also, with a metal probe it may be practical to spray the cleaning fluid through the probe itself. For example in the arrangement of FIG. 10, fluid inlet could be located in the side of the large diameter end of the probe and an outlet can be located in the end face of the small diameter probe end. The fluid would also serve as a coolant to cool the transducer, particularly if dry ice snow were employed.

It will be appreciated by those skilled in the art that various modifications and changes may be made without departing from the scope of the invention, and all such modifications and changes are intended to fall within the scope of the invention, as defined by the appended claims.

What is claimed is:

1. A cleaning apparatus comprising:
    a probe having a solid, elongated forward portion with a substantially constant cross section, and a rear portion with a cross-sectional area larger than the cross-sectional area of said forward portion, said probe being made of a material which efficiently transmits megasonic vibration energy;
    a heat transfer member made of material which is a better heat conductor than that of the probe having one end phase coupled to an end phase of said probe rear portion;
    a container for receiving a cleaning fluid and a wafer to be cleaned, said probe being supported so that said forward portion of the probe is positioned in the container while the probe rear portion is positioned outside of the container; and
    a vibrator coupled to an opposite end face of said member for megasonically vibrating said probe with energy transmitted through the member to produce substantial lateral vibration along the length of the probe so as to dislodge particles on a flat surface of the wafer when said probe forward portion is positioned close to and parallel to the flat surface and the cleaning fluid is applied to the flat surface and said probe forward portion to create a miniscus of fluid between the probe and the flat surface.

2. The apparatus of claim 1, including a support in said container for supporting the wafer, said probe being radially positioned with respect to the wafer, and said support being rotationally mounted.

3. The apparatus of claim 1, including a sprayer positioned to spray cleaning fluid onto the surface of the wafer to produce a layer of fluid between the probe and the surface of the wafer for transmitting vibrational energy to the surface of the wafer.

4. A cleaning apparatus comprising:
    a container for receiving an article to be cleaned;
    a support for said article within said container;
    a probe having an elongated forward portion;
    a support for said probe that positions an elongated side of said probe forward portion in said container generally parallel to a flat surface of said article;
    a source of fluid for applying fluid onto the article, said probe forward portion being sufficiently close to the article so that if fluid extends between the probe and the article, particles on the surface of said article are loosened when said probe oscillates in a megasonic frequency to agitate said fluid; and
    a transducer coupled to said probe, said transducer being adapted to oscillate at said frequency for propagating megasonic energy through said probe and laterally into said fluid between the probe and the article.

5. The apparatus of claim 4, wherein the cross-section of probe is circular and said probe comprises:
    a tip;
    a solid elongated cylindrical portion, wherein said tip and said cylindrical portion are contained within said container; and
    a rear portion external to said container and having a circular cross-section at one end equal in size to the cross-section of said cylindrical portion, and having an opposite end which is larger in diameter than said one end.

6. The apparatus of claim 5, wherein the diameter of the cross-section of said rear portion of said probe increases gradually from said one end to said opposite end.

7. The apparatus of claim 5, wherein the diameter of the cross-section of said rear portion of said probe increases in stepped increments.

8. The apparatus of claim 5, wherein the length of said cylindrical portion of said probe is at least half the length of an article to be cleaned.

9. The apparatus of claim 5, including:
    a heat transfer member coupled to said rear portion of said probe and to said transducer;
    a housing enclosing and supporting said heat transfer member;
    a plate attached to said housing, said plate having an opening through which said probe extends; and
    said plate being connected to said container for supporting said housing on the exterior of the container.

10. The apparatus of claim 9, including a plurality of spacers to space said plate from said container.

11. The apparatus of claim 9, further comprising an annular coolant groove between said housing and said heat transfer member.

12. An apparatus for cleaning semiconductor wafers comprising:
    a tank for receiving cleaning fluid and a wafer to be cleaned;
    a probe including an elongated portion extending into said tank through a tank wall to be positioned adjacent the flat surface of a wafer to be cleaned, and said probe including a rear portion positioned exterior to the container;
    a heat transfer member acoustically coupled to the probe rear portion;
    a transducer acoustically coupled to a rear portion of said heat transfer member to megasonically vibrate the probe; and
    a housing enclosing said heat transfer member and said transducer and mounted to said tank and supporting the heat transfer member, the transducer and the probe with said probe elongated portion being supported in cantilever fashion.

13. The apparatus of claim 12 including a metallic screen and a viscous material applied to the screen compressed between the probe and the heat transfer member to provide the acoustic coupling between the probe and said member.

14. The apparatus of claim 13, including a spring urging the probe towards the heat transfer member.

15. The apparatus of claim 14 including a plate spaced from but fixed to said housing, the plate having an opening through which said probe extends, said plate being spaced from but fixed to said tank; and wherein said spring surrounds said probe and is compressed between said plate and said probe rear portion.

16. A cleaning apparatus comprising:
a container for receiving cleaning fluid in an article to be cleaned;
a probe assembly including an elongated probe portion positioned within the container to be located adjacent to and parallel to a flat surface of said article, and including a rear portion positioned outside of the container, said rear portion having a cross section on one end substantially equal in size to the section of the elongated portion within the container and having an opposite end which is larger in cross section than said one end; and
a transducer coupled to said opposite end adapted to oscillate at a frequency for propagating sonic energy into said container through said probe.

17. The apparatus of claim 16, wherein the portion of said probe within said container is a solid cylindrical portion made of quartz.

18. A cleaning apparatus comprising:
a container for receiving cleaning fluid;
a probe assembly including an elongated probe forward portion extending through and generally perpendicular to a side wall of the container, the assembly including a transducer coupled to the probe for applying megasonic energy to the probe so as to cause vibration of the probe; and
one or more disk-like elements each having a central aperture larger than said probe forward portion, said elements being supported in the container in a generally spaced, parallel, vertical orientation so that when the elements are immersed in cleaning liquid and the probe extends in such apertures, megasonic energy is transmitted laterally outwardly from said probe forward portion along the surfaces of said elements to loosen particles on said elements.

19. An apparatus of claim 18, wherein said probe assembly includes a transducer acoustically coupled to the rear portion of said probe.

20. The apparatus of claim 19, wherein the cross-section of the portion of said probe coupled to said transducer is much larger than the cross-section of the forward rod-like portion of said probe.

21. The apparatus of claim 20, including a housing enclosing the rear portion of said probe and said transducer, said housing being mounted to the exterior of said container.

22. The apparatus of claim 21, including a heat transfer member coupled to the rear of said probe rear portion and to said transducer to conduct vibration from the transducer to the probe, said heat transfer member cooperating with said housing to form coolant passages for conducting heat away from said transducer.

23. The apparatus of claim 18, wherein said probe is formed of quartz, and said forward rod-like portion has a cylindrical cross-section, and said probe rear portion has a generally cylindrical rear portion with a cross-section substantially larger than the forward rod-like portion, with the rear portion further including a transition section extending between the rod-like portion and the rear cylindrical portion.

24. Apparatus for cleaning a semiconductor wafer comprising:

a support for supporting the wafer;
a sprayer for spraying cleaning fluid on an upper surface of the wafer;
a sprayer for spraying cleaning fluid on a lower surface of the wafer;
a probe positioned adjacent the upper surface of the wafer for loosening particles on the upper and lower surfaces of the wafer when megasonic energy is applied to the probe.

25. The apparatus of claim 24 wherein said lower surface sprayer is oriented to direct fluid onto the wafer lower surface beneath the probe.

26. A cleaning apparatus for loosening and removing particles from an article having a planar surface, comprising:
a support for said article;
a probe having an elongated side surface extending close to and generally parallel to the planar surface of said article;
a nozzle positioned to apply cleaning fluid between said probe side surface and said planar surface, said probe being sufficiently close to said surface so that a meniscus of said fluid is formed along the length of said probe between the probe and said surface;
a transducer coupled to the probe and adapted to oscillate at a frequency for propagating megasonic energy through the probe and into said meniscus; and
a motor producing relative movement between the probe and said planar surface while said meniscus is maintained.

27. An apparatus for loosening and removing particles from a semiconductor wafer, comprising:
a rotatable support for said wafer;
an elongated probe having a forward portion having a side surface extending close to but spaced from and generally parallel to an upper planar surface of said wafer, said probe having a rear portion spaced from an outer edge of said wafer which has a cross-sectional area greater than said forward portion;
a heat-transfer member coupled to said probe rear portion;
a transducer coupled to a side of said heat transfer member opposite from the rear portion of said probe and adapted to propagate megasonic energy through the heat transfer member and into the probe the cross sectional area of said transducer being greater than said probe forward portion; and
a nozzle positioned to apply cleaning fluid between the side surface of the forward portion of said probe and said wafer planar surface, said probe forward portion being sufficiently close to said wafer surface that a meniscus of said fluid is formed between the probe and said wafer so that particles on the surface are loosened by the vibrations toward and away from the wafer along the length of said probe produced by the said megasonic energy, and said particles are carried away by said fluid.

28. The apparatus of claim 22, including a second nozzle positioned to apply cleaning fluid to a flat bottom surface of said wafer beneath said probe to produce particle loosening vibration in the fluid on the bottom surface of the wafer simultaneously with that on the upper surface.

* * * * *

UNITED STATES PATENT AND TRADEMARK OFFICE
CERTIFICATE OF CORRECTION

PATENT NO. : 6,039,059

DATED : March 21, 2000

INVENTOR(S): Mario E. Bran

It is certified that error appears in the above-identified patent and that said Letters Patent is hereby corrected as shown below:

Column 6, line 27, change "prevent" to -- present --.

Column 6, line 59, change "145" to -- 16 --.

Column 7, line 15, change "216" to -- 115 --.

Column 7, line 28, change "218" to -- in Fig. 6 --.

Column 8, delete "306".

In Fig. 6, change "116" to -- 216 --.

In Fig. 6, add numeral "218" to identify the double ended arrow.

Signed and Sealed this

Third Day of April, 2001

*Attest:*

NICHOLAS P. GODICI

*Attesting Officer*  Acting Director of the United States Patent and Trademark Office